United States Patent [19]

Allen

[11] Patent Number: 4,496,094
[45] Date of Patent: Jan. 29, 1985

[54] PADDLECARD TERMINATOR

[75] Inventor: Leslie J. Allen, Swindon, England

[73] Assignee: Raychem Corporation, Menlo Park, Calif.

[21] Appl. No.: 328,761

[22] Filed: Dec. 8, 1981

[51] Int. Cl.³ .............................................. B23K 3/00
[52] U.S. Cl. ...................................... 228/56; 228/180 A
[58] Field of Search ........................ 228/56 R, 180 A; 174/84 R, 88 R; 339/275 R, 275 B

[56] References Cited

U.S. PATENT DOCUMENTS

| 3,396,894 | 8/1968 | Ellis | 228/56 R |
| 3,719,981 | 3/1973 | Steitz | 29/423 |
| 3,750,252 | 8/1973 | Landman | 228/245 |
| 4,099,038 | 4/1978 | Purdy | 339/17 F |
| 4,354,629 | 10/1982 | Grassauer et al. | 228/180 A |

Primary Examiner—Kenneth J. Ramsey
Assistant Examiner—M. Jordan
Attorney, Agent, or Firm—Ira D. Blecker; James W. Peterson; Herbert G. Burkard

[57] ABSTRACT

A solder-containing polymeric terminator provides strain-relieved, insulated terminations between conductors and, especially, flat substrates. The terminator comprises two polymeric layers, the first of which has windows through which soldered electrical connections may be made, and the second of which is heat recoverable and attached to the first to form pockets to receive the conductors, and solder strips positioned between the layers and in proximity to the windows.

9 Claims, 14 Drawing Figures

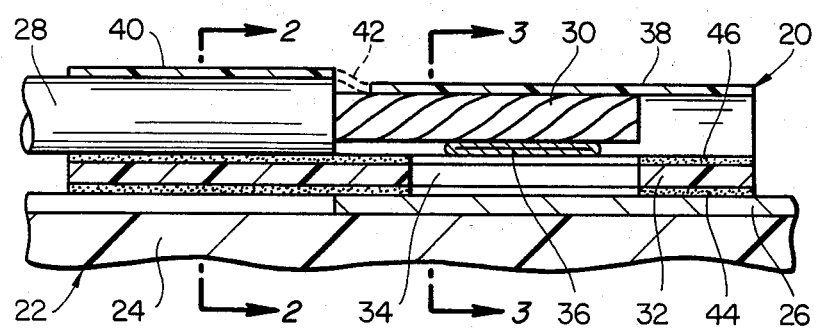
FIG_1
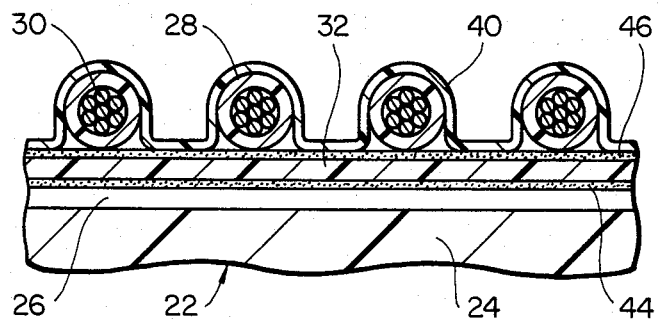
FIG_2
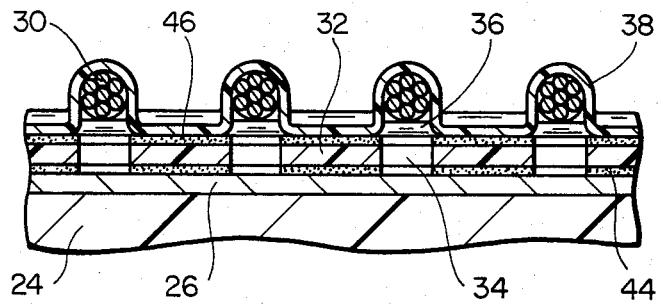
FIG_3

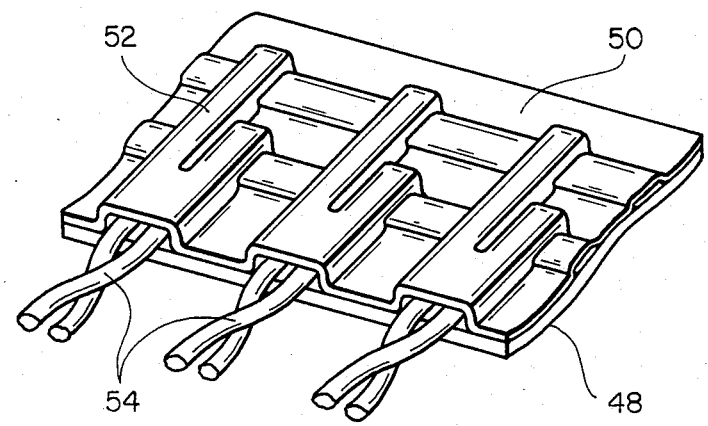
FIG_4
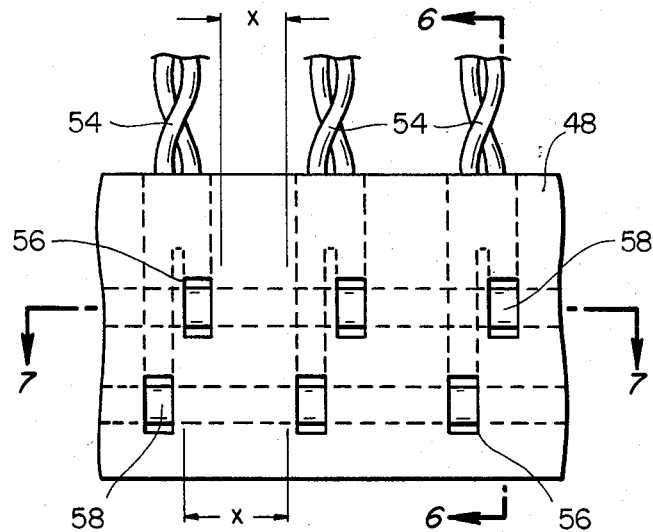
FIG_5
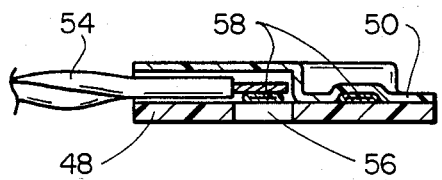
FIG_6
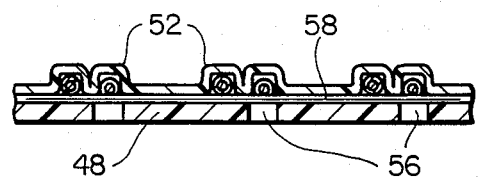
FIG_7

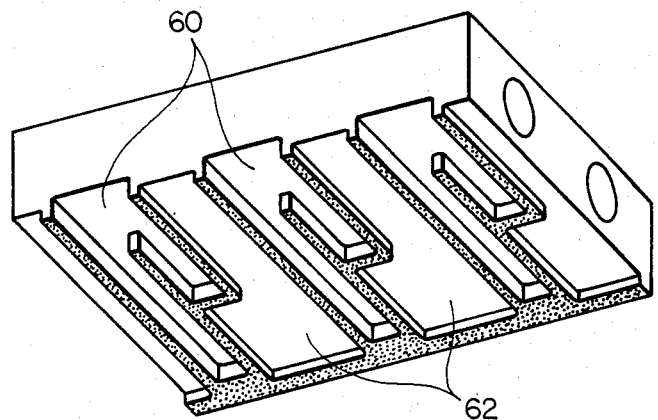
FIG_8
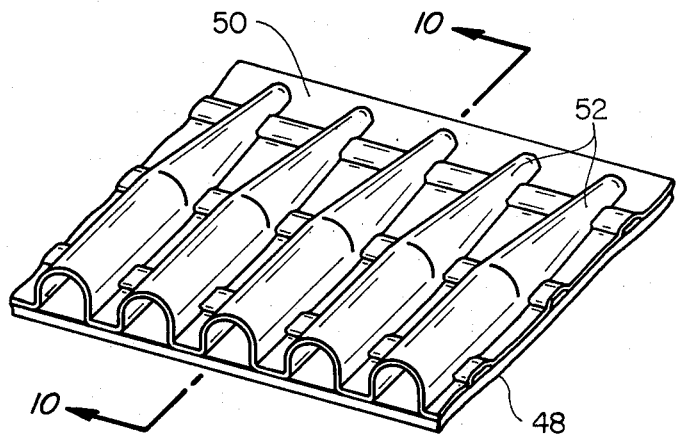
FIG_9
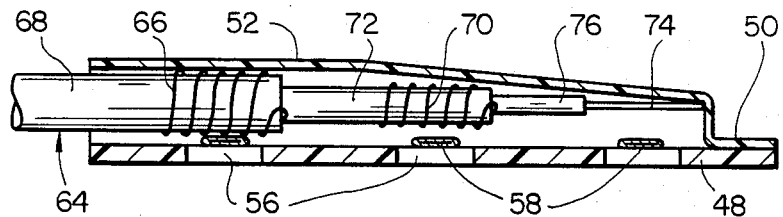
FIG_10

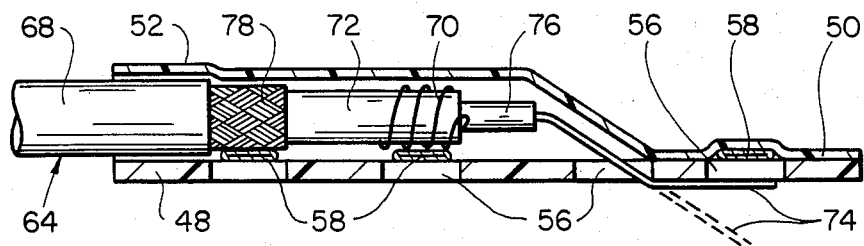
FIG_11
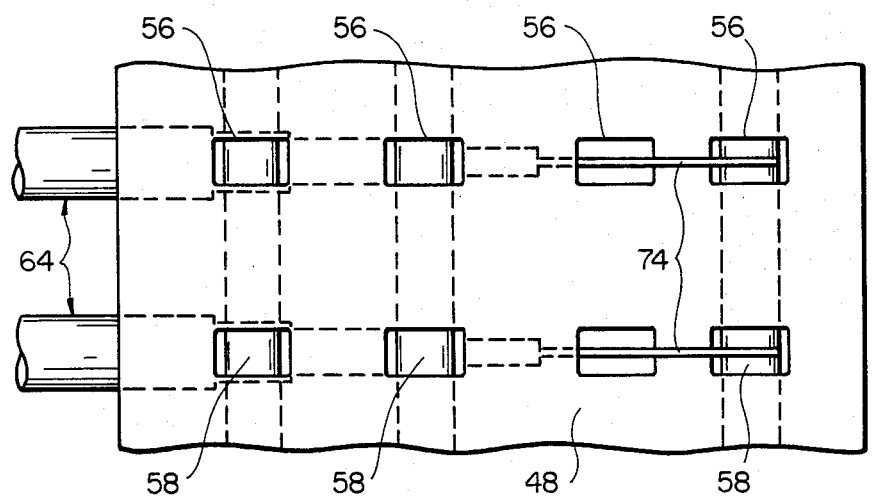
FIG_12
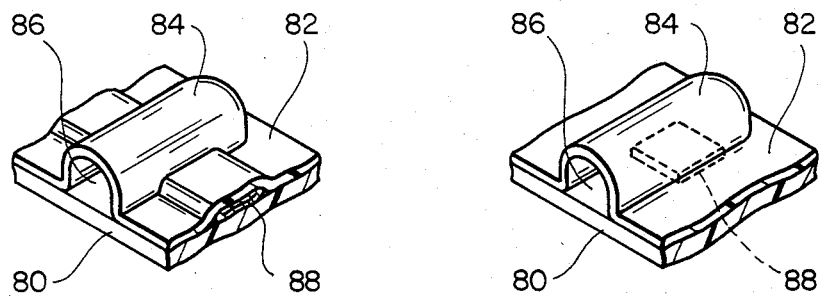
FIG_13     FIG_14

PADDLECARD TERMINATOR

FIELD OF THE INVENTION

This invention relates to terminators, and more especially to terminators adapted to provide a strain-relieved, insulated connection between a conductor and a flat substrate.

BACKGROUND OF THE INVENTION

With the decreasing size of electronic devices in general, the increasing density of component packing has required an increasing density of interconnections, especially to flat substrates such as printed circuit devices, etc. Since such interconnections are typically made by soldering, a reliable soldering technique for terminating conductors, especially multiaxial cables or twisted pairs, etc. to such substrates is desirable. It is especially desirable that any such terminations be strain-relieved and/or insulated.

In the past, various systems have been developed for simultaneously applying a plurality of bodies of solder. One such system is that disclosed in U.S. Pat. No. 3,396,894, which discloses the prepackaging of metered amounts of flux and solder in a heat-recoverable preformed polymer sheet which forces the solder into place. The patent teaches the use of discrete pieces of solder which must be precisely positioned above regions to be soldered. As heat is applied, the polymer sheet returns to its original flat configuration prior to solder melting.

U.S. Pat. No. 3,719,981 discloses an alternative method of applying solder balls, which are appropriately spaced on the tacky surface of a pressure-sensitive tape, to solder bumps used for connections.

Both of the above methods rely on the positioning of the small pieces of solder immediately adjacent to the terminals which are to be soldered, and, because small pieces of solder are used, each of the solder systems disclosed is difficult to manufacture.

U.S. Pat. No. 3,750,252 discloses the use of a single continuous piece of solder to simultaneously solder a large number of terminals. The solder wire extends along a terminal strip and, on heating, the solder melts and coalesces on the individual contacts to form independent connections.

U.S. application Ser. No. 158,034, filed Jun. 9, 1980, now U.S. Pat. No. 4,354,629 assigned to the assignee of the present invention, describes the use of a device having a continuous solder strip in contact with a polymeric layer having window means therein. In this application, the disclosure of which is incorporated herein by reference, the device is used to terminate multiconductor cables, and the window means control and direct the flow of solder.

U.S. patent application Ser. No. 172,897, filed July 28, 1980, now abandoned also assigned to the assignee of the present invention, describes a mass connector device comprising two layers of polymeric material, at least one of which is heat recoverable. In this application, the disclosure of which is incorporated herein by reference, the layers are bonded to form pockets, into which may be inserted substrates to be connected.

SUMMARY OF THE INVENTION

The present invention provides a terminator which is capable of providing strain-relieved, insulated terminations between conductors and, especially, flat substrates such as printed circuit boards. The terminator comprises two polymeric layers, one of which has windows and the other of which is heat recoverable, with the two attached so as to form pockets to receive the conductors to be terminated, and solder strips positioned between the layers and adjacent to the windows.

BRIEF DESCRIPTION OF THE DRAWING

FIG. 1 is a cross-sectional view of a first emodiment of this invention used to terminate a wire to a flat substrate.

FIG. 2 is a cross-section through line 2—2 and FIG. 3 a cross-section through line 3—3 of FIG. 1.

FIG. 4 is a perspective view of a second embodiment of this invention used to terminate twisted pairs.

FIG. 5 is a view of this second embodiment from beneath, while FIGS. 6 and 7 are cross-sections through lines 6—6 and 7—7, respectively, of FIG. 5.

FIG. 8 is a perspective view of a heater platen for use with the embodiment of FIG. 4.

FIG. 9 is a perspective view of a third embodiment designed for terminating triaxial cable.

FIG. 10 is a cross-section through line 10—10 of FIG. 9, also showing an inserted triaxial cable.

FIG. 11 is similar to FIG. 10 but shows an alternative method of positioning the center conductor, while FIG. 12 is an underneath view of the embodiment of FIG. 11.

FIGS. 13 and 14 depict the operation of the polymer layers and the solder during termination.

DESCRIPTION OF THE PREFERRED EMBODIMENTS

As used herein, solder means any metal or metallic alloy used to join metallic surfaces by melting that metal or metallic alloy and then allowing it to cool. A solder strip, as used herein, means an elongated, continuous element of solder of any cross-section including, but not limited to, round, square, flat, or any other cross-section. Such a solder strip may contain a flux core and/or may be coated on all or a part of its outer surface with a flux coating. The strip may be perforated to enable better flow of a flux core.

The terminator of this invention comprises a first polymeric layer having window means therein, a second, heat recoverable, polymeric layer bonded to the first layer so as to form pockets to receive conductors to be terminated, and solder strip positioned between the layers and adjacent to the windows. By "adjacent to the windows" is meant that, in operation, the solder will flow through the windows. The solder is preferably superimposed on the windows.

The polymeric layers should preferably be made of materials capable of resisting elevated temperatures for the time needed to melt and flow the solder, generally about 15 seconds. Suitable materials include, for example and not by way of limitation, polyvinylidene fluoride, poly(parabanic acid), and poly(pyromelittimide) or other high-temperature polyamides or -imides. These polymers may be cross-linked by either chemicals or radiation to improve their high-temperature properties.

Lower-temperature polymers, such as polyethylene, etc., may be used depending on the particular use to which the terminator is to be put, and the choice of suitable materials is considered to be within the scope of one skilled in the art in view of this disclosure.

While the provision of adhesive and sealant layers is contemplated by this invention, and will be discussed in more detail below with respect to certain preferred areas, it is also contemplated that the polymeric layers may themselves have adhesive properties, even though they are generally required to be non-melting in use. Such properties may be particularly desirable for the window layer, and may be provided, for example, by extensive cross-linking of an adhesive material. By this means, the device may be adhered to a substrate in use.

While the window layer is heat-stable, the backing layer, which forms the pockets, is heat recoverable. Heat recoverable polymers and methods of rendering polymeric articles heat recoverable, are well known in the art. These are generally cross-linked, at least partially crystalline polymers, or mixtures incorporating them.

The polymeric materials can be tailored to suit the intended use by the addition of fillers, e.g. flame-retardants, plasticizers, pigments, stabilizers, co-curing agents to facilitate cross-linking, etc.

The polymeric materials used in the construction of this invention are important in the transfer of thermal energy. While the primary heat transfer occurs through the metallic elements, including the conductors, terminals, and solder, a significant amount of heat is transferred through the window in a parallel manner. Additionally, the flux trapped within the window spaces is a significant source of circulatory liquid and vapor mass heat transfer. The presence of these additional heat transfer paths contributes to the overall speed and quality of the desired solder connections.

FIG. 1 is a cross-sectional view through a pocket of a first embodiment of this invention where the terminator shown generally at 20 is being used to terminate a conductor to a flat substrate, such as a PC board shown generally at 22 and comprising an insulating support 24 and conductive region 26. The wire 28 having conductor 30 has been inserted into terminator 20. The terminator comprises a first polymeric layer 32 having a window 34 therein (the window layer), a solder strip 36 positioned adjacent the window 34, and a polymeric backing layer which is shown here as two regions 38, over the conductor 30, and 40, over the insulation of wire 28. If these regions were joined by the region 42 shown in phantom, a unitary backing layer would be formed. This backing layer is heat recoverable. The window layer is adhered to the substrate 22 by adhesive layer 44 and to the backing layer by adhesive layer 46. Alternatively, the window layer may be itself adhesive and/or be fusion bonded or otherwise attached to the backing layer.

When the conductor is inserted so that it overlays the window 34 and heat and pressure are applied, solder 36 fuses to form an electrical connection between the conductor 30 and conductive region 26 through the window 36, and the backing layer recovers (shrinks) to encapsulate the wire, thereby insulating and strain-relieving the connection thus formed.

FIG. 2 is a cross-section through line 2—2 of FIG. 1 illustrating the wire 28 in the pocket formed between layers 32 and 40, while FIG. 3, which is a cross-section through line 3—3 of FIG. 1, illustrates the conductor in position above the solder 36 and windows 34.

FIG. 4 depicts in perspective a second embodiment useful for the termination of twisted pair wires. The terminator comprises a window layer 48 and backing layer 50 bonded together appropriately, with pockets 52 formed in backing layer 5. Wires 54 are shown inserted into the pockets, which are shaped such that the ends of wires 54, cut and stripped to different lengths, enter separate sub-pockets for termination. These sub-pockets end above two rows of windows 56 as shown in FIG. 5, which is a bottom view of the terminator of FIG. 4. Window layer 48 has two rows of windows 56, with a solder strip 58 shown mostly in phantom, between layers 48 and 50 and adjacent each window.

FIG. 6 is a cross-section through line 6—6 of FIG. 5, and depicts one of the pair 54, in a manner similar to FIG. 1. FIG. 7 is a cross-section through line 7—7 of FIG. 5, and shows one row of windows 56, with the corresponding solder strip 58 and the pair of sub-pockets of pocket 52.

Soldering the wires through the windows is accomplished by application of heat and pressure, which will also cause the pad to become properly heated for effective soldering. The spaces along the solder strips whose length is indicated by "x" in FIG. 5 may be left unheated, and will then remain unmelted and free from contact with anything but the polymer layers surrounding them. The solder in and around the window will have been heated and propelled into the window by force from a heating tool, which is shown in FIG. 8 in perspective view from underneath. in FIG. 8, the shaded region is in the plane of the window layers, causing the heating and separation of the solder, while relief area 60 defines a cavity for the wires in the pockets. Relief area 62, if present, allows for the unmelted solder regions discussed above, but if that relief is absent, all the solder would be forced from between the wire cavities into the window areas. A smaller center-to-center spacing or alternative tool design could produce the same effect.

Some variations can be made in the invention to accomodate the general physical characteristics of coaxial, triaxial or other multiaxial wire cables. Most have a centrally located center wire surrounded with a thick wall insulation to provide a large dimensional separation from the next coaxial wire. This next wire is also wrapped with a thin electrically conductive foil to create a shield. Sometimes this second wire is replaced entirely by a multitude of smaller, braided wires forming a net like shield. This can be followed by a third wire, braid, etc., to provide additional electrical and/or mechanical shielding.

Thus there are two or more electrical connections to make per multiaxial cable. In addition the geometric dimension considerations present unusual problems when it is desired to electrically and mechanically join these cables to flat surfaces. The following variation of the invention as shown in FIGS. 9 through 12 will illustrate its usefulness.

FIG. 9 is a top perspective view of a terminator designed for coaxial wire. The window layer 48 and backing layer 50 form pockets 52.

FIG. 10 is a cross-section through one pocket of the embodiment of FIG. 9, with a triaxial cable 64 inserted in pocket 50. Here, each of the three conductors to be terminated, outer conductor 66 (which has been wound back over insulation 68), middle conductor 70 (which has been wound back over insulation 72), and center conductor 74 (protruding from insulation 76), are shown emplaced above solder strips 58 and windows 56 formed in window layer 48. Termination is again accomplished by heat and pressure, using an appropriately-shaped heating tool.

FIG. 11 is a view similar to FIG. 10 except that 4 windows are present per pocket. Three of the windows are used in controlling the placement of solder and the formation of inter connections between the conductors and substrates, while the fourth permits the passage of a center conductor 74. In this way, the thin center conductor 74 is brought into direct contact with the substrate when the terminator is in place, helping to ensure a good solder joint. In this figure, also, the outer conductor has been shown as a braid 78, as is common with multiaxial wire.

FIG. 12 is a bottom view of the embodiment of FIG. 11, when the center conductor 74 can be clearly seen below the window layer 48.

This system is of course applicable to coaxial cables, where one less window and solder strip is required.

Strain and relief for the connection formed is provided by recovery of pocket 52 about the wire 64 while either polymeric layer may have adhesive associated therewith, as discussed elsewhere.

FIGS. 13 and 14, which show a single pocket and solder strip for simplicity, clarify the operation of the invention. Window layer 80 and backing layer 82, with pocket 84 therein, are bonded together except over area 86 (to form the pocket) and in the vicinity of solder strip 88. This permits the use of a continuous solder strip in manufacture. During soldering, force is applied to all areas immediately around the pocket, which forces the solder into the window region 88 shown in phantom and seals the edges of layers 80 and 82 together.

It is, of course, possible for the backing layer not be heat recoverable so that the pockets formed act merely as a guide for conductors, but the use of a heat recoverable layer is especially advantageous in that (a) the pocket may be made sufficiently large that wire insertion is easy without fear of loss of alignment, and (b) the recovery of the backing layer on the wire strain-relieves the termination. This is especially useful if a sealant or adhesive is present on the backing layer or in the pocket.

It should be remembered that although this invention is particularly applicable to the termination of a plurality of wires to a substrate, and indeed most of the Figures illustrate such configurations, this invention is also useful for the termination of only one wire, where there is but a single pocket in the backing layer. Not only is the termination made reliably, but the terminator may be especially economical because individual terminators may be prepared by cutting them from a multiple terminator strip made by automatic or semi-automatic methods, in contrast to the usual terminator.

Although this invention has been discussed and illustrated particularly with reference to the use of solder strips, since these render the terminator easily capable of high-speed manufacture, it is within the contemplation of this invention that individual solder inserts such as are described in the aforementioned Application Ser. No 172,897 may be used.

Although the foregoing discussion, and the Figures, have shown the window means aligned in one or more straight rows, within the scope of the invention for them to be staggered in, for example, a saw tooth or stair-step configuration. Such a staggered arrangement may aid in improving the reliability of the terminations thus formed and allowing a greater density of terminations.

An advantage of the terminator of this invention is that it readily permits "tapping" a flat cable or similar substrate at a plurality of points. The insulation may be stripped from one side only of the cable, and a terminator according to this invention used to make connections between the thus-exposed conductors of the cable and other conductors. While the terminator would normally be placed parallel to the cable, if a stair-step configuration of the windows is used, it may be placed perpendicular to the cable to allow an extremely convenient "tap".

From the foregoing detailed description of several embodiments of this invention, it is evident that there may be a number of changes, adaptations, and modifications which come within the province of those skilled in the art. However, it is intended that all such variations not departing from the spirit of the invention should be considered within the scope thereof as limited solely by the appended claims.

We claim:

1. A terminator which comprises:
    (a) a first, heat stable, polymeric layer having window means therein;
    (b) a second, heat recoverable, polymeric layer bonded to said first layer to form a pocket containing said window means to receive a conductor to be terminated; and
    (c) a strip of solder disposed between and in operative contact with said polymeric layers and adjacent said window means; said window means being adapted to direct the flow of solder and flux from said solder strip and to permit the formation of a soldered electrical interconnection between a conductor inserted in said pocket and a substrate adjacent said first layer wherein said heat stable layer having said window means is interposed between the conductor and the substrate, and said second layer being capable of recovery to entirely encapsulate said interconnection when said terminator is heated.

2. A terminator as in claim 1 wherein the first polymeric layer has a plurality of window means in each pocket, and a solder strip for each window means, thereby to be capable of terminating multi-conductor wire.

3. A terminator as in claim 1 wherein the first polymeric layer has a single window means in each pocket, thereby to be capable of terminating single conductors.

4. A terminator as in claim 1 wherein there are a plurality of pockets.

5. A terminator as in claim 1 wherein there is only one pocket.

6. A terminator as in claim 1 wherein at least one of the polymeric layers has adhesive character.

7. A terminator as in claim 6 wherein the first polymeric layer has adhesive character.

8. A terminator as in claim 6 wherein said at least one layer is coated on at least one side with an adhesive.

9. A terminator as in claim 6 wherein said at least one layer is intrinsically adhesive.

* * * * *